United States Patent [19]

Archer et al.

[11] 3,757,123

[45] Sept. 4, 1973

[54] SCHOTTKY BARRIER INFRARED DETECTOR HAVING ULTRATHIN METAL LAYER

[75] Inventors: Robert J. Archer, Portola Valley; Jerome Cohen, San Mateo, both of Calif.

[73] Assignee: Hewlett-Packard Company, Palo Alto, Calif.

[22] Filed: July 19, 1972

[21] Appl. No.: 273,093

Related U.S. Application Data

[63] Continuation of Ser. No. 43,836, June 5, 1970, abandoned.

[52] U.S. Cl .......... 250/338

[51] Int. Cl. .......... G01t 1/24

[58] Field of Search .......... 250/83 R, 83.3 H; 313/101; 338/15; 317/235 UA, 235 N

[56] References Cited

UNITED STATES PATENTS

| | | | |
|---|---|---|---|
| 3,529,161 | 9/1970 | Oosthoek et al. | 250/83 R |
| 3,571,593 | 3/1971 | Komatsubara | 250/83.3 H |
| 3,219,823 | 11/1965 | Gibson et al. | 250/83.3 H |
| 3,349,297 | 10/1967 | Crowell et al. | 317/235 UA |

*Primary Examiner*—James W. Lawrence
*Assistant Examiner*—Davis L. Willis
*Attorney*—A. C. Smith

[57] ABSTRACT

A metal film less than 100 Angstroms thick is deposited on one face of a semiconductor substrate to form a Schottky-barrier diode. Photons absorbed in the metal form electron-hole pairs; and those carriers with sufficient energy, in the right direction to cross the Schottky barrier, cause a current which is proportional to the incident radiant flux.

8 Claims, 3 Drawing Figures

INVENTORS
ROBERT J. ARCHER
JEROME COHEN

BY Q. C. Smith

ATTORNEY

SCHOTTKY BARRIER INFRARED DETECTOR HAVING ULTRATHIN METAL LAYER

This is a continuation of U.S. Pat. application Ser. No. 43,836, filed June 5, 1970 and now abandoned.

BACKGROUND AND SUMMARY OF THE INVENTION

Solid state infrared detectors used in the past generally fall into two categories, photoconductors and photodiodes. Photoconductors are materials in which either electrons or holes are excited into a conductive state by photons absorbed in the material. These materials are usually characterized by a resistance that is inversely proportional to radiant flux. Two of the major limitations of these devices are their slow response times and low sensitivities or high noise figures. In a junction type photodiode electron-hole pairs are generated in the junction region by photon absorption and these devices are characterized by an output current proportional to the radiant flux. Junction photodiodes have faster response times than photoconductors but they are also not high sensitivity devices.

Accordingly, it is an object of this invention to provide an infrared detector which has a high sensitivity.

It is a further object of this invention to provide an infrared detector which is fast and which can be formed into uniform arrays.

A Schottky-barrier infrared detector is comprised of a doped semiconductor with a thin metal deposit on one face of the piece of semiconductor, the metal forming a rectifying junction with the semiconductor. Both p- and n-type semiconductors have been used, and a number of different metals are suitable for the thin deposit. If the metal is made thinner than about 100 Angstroms, specifically on the order of 40 to 75 Angstroms, the efficiency or yield of the detector is more than tenfold greater than that of a typical Schottky-barrier type detector with a metal deposit 2,000 Angstroms or more in thickness. This effect is especially pronounced in the 2 to 12 micron wavelength region. The detector is also more sensitive than p-n junction photodiodes by several orders of magnitude.

In use photons can be incident from either the metal or the semiconductor side of the contact. When incident from the semiconductor side the photons pass through the semiconductor material and impinge on the metal film, a portion of the incident photons are absorbed in the metal and form electron-hole pairs. The empty state below the Fermi level in the metal, produced by photoexcitation, is defined here as a hole. Depending upon the type of semiconductor, holes or electrons with sufficient energy, travelling toward the barrier, will go over the barrier and form a current proportional to the radiant flux.

DESCRIPTION OF THE PREFERRED EMBODIMENT

Figure 1:
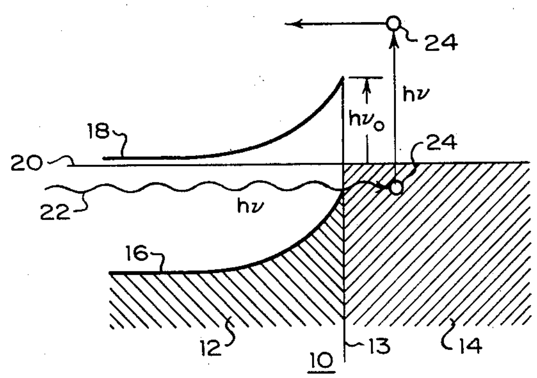
FIG. 1 shows an energy level diagram of a preferred embodiment of the optical detector.

FIG. 1 shows an energy level diagram of an optical detector 10 comprised of a semiconductor 12 which forms a junction 13 or Schottky barrier with metal film 14. Semiconductor 12 is illustrated as an n-type semiconductor but it could equally well be a p-type semiconductor, as will be apparent from the discussion. Energy level 16 is the top of the valence band in semiconductor 12 and energy level 18 is the bottom of the conduction band. Energy level 20 is the Fermi level. The height of the Schottky barrier is shown as $h\nu_o$ where $h$ is Planck's constant and $\nu_o$ is the threshold frequency of the detector. A photon 22 with energy $h\nu$ is schematically represented coming through semiconductor 12, which is typically transparent to infrared radiation, and transferring its energy to an electron 24. In the illustration $h\nu$ is shown greater than $h\nu_o$ and therefore electron 24 has enough energy to get over the barrier at junction 13, provided it is traveling in the right direction. Once across the barrier electron 24 will continue to the left and is scattered to a lower energy level in the conduction band of semiconductor 12. If semiconductor 12 were p-type an analogous process would take place for a hole.

Figure 2:
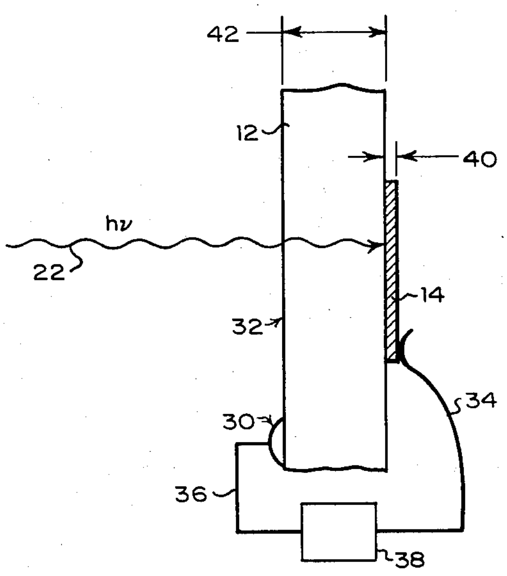
FIG. 2 shows a cross-sectional view of a preferred embodiment of the optical detector.

FIG. 2 shows a schematic cross-sectional view of optical detector 10. Metal film 14 is shown deposited on semiconductor 12 along with a non-rectifying contact 30. Photon 22 is shown incident on polished face 32 of semiconductor 12. Wires 34 and 36 make contact with metal 14 and contact 30 respectively and wires 34 and 36 connect to utilization circuits 38 which measure the photo current from optical detector 10 and may also include a bias voltage supply for detector 10. In practice, several materials have been used for semiconductor 12, e.g. p- and n-type silicon and p-type germanium; gold, silver, and nickel have been used for metal film 14. Other materials can of course be used and these are offered only as examples. Although detectors constructed of most of the materials are operable at room temperature, detectors constructed of some of these materials must be operated at reduced temperatures, often below 77° K, the boiling point of liquid nitrogen. Thickness 42 of semiconductor 12 is typically 0.25 millimeters.

The yield, Y of photo emission over a Schottky barrier has been found to follow the relationship:

$$Y = K\,(h\nu - h\nu_o)^2/h\nu$$

where K is a constant which depends on the materials and dimensions of the device and Y is defined as the ratio of the electron or hole flux to the incident photon flux. In particular, it has been found that K is much larger and therefore yield is much larger for devices having a metal film 14 with a thickness 40 of approximately 40 Angstroms to 75 Angstroms than for devices with a thickness 40 of more than 100 Angstroms and very much larger than devices with thickness 40 of more than 1,000 Angstroms. In this disclosure approximately is defined as ±10 Angstroms. It is believed that this increased yield is due to two factors: increased optical absorption in very thin films and multiple reflections of electrons or holes (carriers) from the metal surfaces. Both theory and measurement confirm that for metal films less than 100 Angstroms thick, and especially between approximately 40 to 75 Angstroms thick, infrared photon absorption is much greater than for thicker films. The photoemissive yield is proportional to the fraction of incident photons which is absorbed. In a metal film less than 100 Angstroms thick, the mean free path of excited carriers is greater than the film thickness, thus a carrier travelling away from barrier 13 may be reflected from the metal surface and travel back over the barrier before it falls from its excited state. It has also been observed that these effects are especially pronounced in the 2 to 12 micron wavelength region; even for radiation as close as 1.2 microns the effect is only a fraction of that observed at 2 to 12 microns.

As an example, a device constructed of p-type germanium for semiconductor 12 with a thickness 42 of 0.25 millimeters, gold for metal film 14 with a thickness of 40 Angstroms has K = 13 percent per electron volt when measured at 5° K. In the same example, for $h\nu =$ 0.12 electron volts, Y = 1.4 percent, and the range of wavelengths for which the device is useful extends from 2 to 12 microns. This performance is 45 times the yield of a conventional device constructed using a gold film 14 with thickness of 2,000 Angstroms.

Detectivity, denoted $D^*\lambda$, for a device constructed of p-type silicon and gold according to the present invention, is calculated to be on the order of $10^{14}$ cm Hz½/W in the 2–4$\mu$ wavelength region compared with the best p-n junction devices which are on the order of $10^{12}$ cm Hz½/W: a factor of 100 improvement. The speed of devices constructed according to the present invention allows bandwidths of up to 20 gigahertz or more depending upon the type of circuitry connected to the detector. High response speed makes detector 10 suitable for use in optical communications systems using lasers with microwave modulation frequencies, for example, as well as other high speed optical systems.

Figure 3:
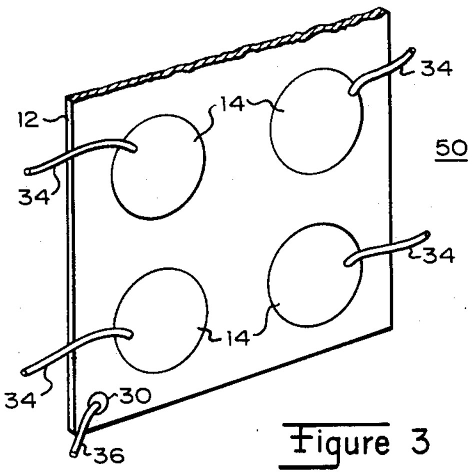
FIG. 3 shows a perspective view of an array of optical detectors constructed in accordance with the preferred embodiment.

FIG. 3 shows an array 50 of optical detectors comprised of a single semiconductor substrate 12 and a number of metal films 14. Leads 34 and 36 connect to utilization circuits (not shown). Array 50 might be used, for example, in a vidicon where a large number of detectors with high sensitivity and uniform properties are needed.

We claim:

1. A detector for infrared radiation between 2 and 12 microns in wavelength comprising:
   - a semiconductor transparent to the detected radiation;
   - a metal film, less than 100 Angstroms thick, deposited on a portion of the semiconductor and forming a Schottky barrier with the semiconductor, the detected radiation being absorbed in the metal film and the Schottky barrier height being less than the photon energy of the detected radiation; and
   - a non-rectifying contact to the semiconductor.

2. A detector as in claim 1 wherein the metal film is approximately 40 to 75 Angstroms thick.

3. A detector as in claim 1 wherein the metal film is less than 75 Angstroms thick.

4. A detector as in claim 2 wherein the semiconductor is silicon and the metal is gold.

5. A detector as in claim 2 wherein the semiconductor is p-type germanium and the metal is gold.

6. A detector as in claim 1 wherein the detector is maintained at a temperature below 77° K.

7. A detector as in claim 1 wherein the radiation detected is incident upon the semiconductor.

8. A detector as in claim 1 wherein there is a plurality of distinct and separate metal films deposited on the semiconductor, with circuit means connected to the plurality of metal films and the non-rectifying contact for responding to signals thereon.

* * * * *